United States Patent [19]

Hozumi et al.

[11] Patent Number: 4,980,748
[45] Date of Patent: Dec. 25, 1990

[54] SEMICONDUCTOR DEVICE MADE WITH A TRENCHING PROCESS

[75] Inventors: Hiroki Hozumi; Minoru Nakamura; Hiroyuki Miwa; Akio Kayanuma, all of Kanagawa, Japan

[73] Assignee: Sony Corporation, Tokyo, Japan

[21] Appl. No.: 361,554

[22] Filed: Jun. 5, 1989

[30] Foreign Application Priority Data

Jun. 30, 1988 [JP] Japan .................. 63-163804

[51] Int. Cl.⁵ .................................. H01L 27/04
[52] U.S. Cl. .......................... 357/50; 357/49; 357/55
[58] Field of Search ................ 357/49, 51, 55, 50

[56] References Cited

U.S. PATENT DOCUMENTS

| | | | |
|---|---|---|---|
| 4,466,177 | 8/1984 | Chao | 357/51 |
| 4,470,024 | 9/1984 | Leuenberger | 357/51 |
| 4,609,934 | 9/1986 | Haskell | 357/55 |
| 4,688,069 | 8/1987 | Joy et al. | 357/49 |
| 4,799,099 | 1/1989 | Verret et al. | 357/50 |

OTHER PUBLICATIONS

Kemlage, "Multiple Depth Dielectric Isolation from a Single mask", Sept., 1979, IBM Technical Disclosure Bulletin, vol. 22, No. 4.

*Primary Examiner*—Andrew J. James
*Assistant Examiner*—Courtney A. Bowers
*Attorney, Agent, or Firm*—Hill, Van Santen, Steadman & Simpson

[57] ABSTRACT

In a semiconductor device having trench-shaped element isolating regions formed in a semiconductor body and also a conductive layer extending on each element isolating region and connected to an impurity diffusion region of the semiconductor body, there is formed an insulator layer region between an extension of the conductive layer and the element isolating region, and the insulator layer region is buried in the surface portion of the semiconductor body. In such construction, the insulation space between the conductive layer and the semiconductor body can be increased while the distance between the element isolating region and the impurity diffusion region can be shortened to consequently diminish the parasitic capacitance between the conductive layer and the semiconductor body, hence attaining a faster operation in the semiconductor device. When the present invention is applied to a bipolar transistor integrated circuit, a superfast operation is ensured due to the reduction of the base-to-collector capacitance.

2 Claims, 13 Drawing Sheets

SEMICONDUCTOR DEVICE MADE WITH A TRENCHING PROCESS

REFERENCES TO RELATED APPLICATIONS

This invention is related to application Ser. No. 175,263, filed Mar. 30, 1988, entitled "BIPOLAR TRANSISTOR", in which the inventor is Akio Kayanuma, assigned to the assignee of the present application.

BACKGROUND OF THE INVENTION

1. Field of the Invention

The present invention relates to a semiconductor device which can be used as a superfast bipolar transistor integrated circuit or the like.

2. Description of the Related Art

There has recently been proposed a bipolar transistor integrated circuit which is produced by a trenching isolation process which produces desired isolation of component elements by forming a sectionally V-shaped or U-shaped deep ditch or trench in an element isolating region of the circuit.

Figure 4:
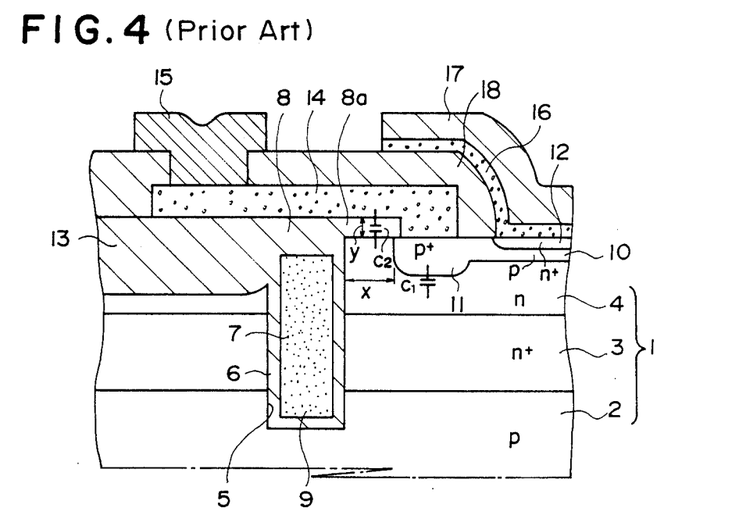
FIG. 4 is a sectional view of principal components in a conventional semiconductor device.

FIG. 4 illustrates principal portions of a conventional bipolar transistor integrated circuit manufactured by employing such a trenching isolation process. In this structure, a silicon semiconductor body 1 is formed by epitaxially depositing on a p-type silicon substrate 2, for example, an n-type semiconductor layer 3 which serves as a collector buried region. A high-resistivity n-type semiconductor layer 4 serves as a collector region. Subsequently an element isolating trench 5 is formed in the semiconductor body 1 and, then the inner surfaces of trench 5 are oxidized to form a silicon dioxide ($SiO_2$) film 6 after which a polycrystal silicon layer 7 and a silicon dioxide layer 8 are buried in the trench 5 to form a trenched element isolating region 9.

Also shown are a p-type base region 10, a p+ base contact region 11, an n-type emitter region 12, and a field oxide layer 13 which is formed by selective oxidation (LOCOS).

The p+ base contact region 11 is formed by diffusion of boron (B) or the like from a polycrystal silicon layer 14 which is doped with a p-type impurity such as boron, and the polycrystal silicon layer 14 is sued as a leadwire for the base electrode 15. The emitter region 12 is formed by diffusion of arsenic (As) or the like from a polycrystal silicon layer 16 which is doped with an n-type impurity such as arsenic, and an emitter electrode 17 is formed on the polycrystal silicon layer 16. Although not shown, a collector electrode is formed to connect to the collector buried region 3. A silicon layer 18 separates layers 14 and 16.

During the forming of the p+ base contact region 11, the silicon dioxide layer 8a on the body 1 including the isolating region 9 is first patterned, then the boron-doped polycrystal silicon layer 14 which is deposited thereon is patterned, and subsequently a heat treatment process is executed. During this stage, there may be performed a process of entirely removing the silicon dioxide layer 8a by etching. However, such a technique also causes a partial removal of the inner silicon dioxide layer 8 which exists in the trench 5 which will consequently cause a level difference. The level difference has a harmful influence on the subsequent process steps. So as to eliminate this problem, the silicon dioxide layer 8a is provided to maintain a flat surface.

In the bipolar transistor shown in FIG. 4, it is necessary to reduce the capacitance $C_{CB}$ between the collector and the base so as to obtain fast operation. Such capacitance $C_{CB}$ is determined principally by the sum of the p+ −n junction capacitance $C_1$ in the base contact region 11 and the capacitance between the polycrystal silicon layer 14 and the collector region 4 with the silicon dioxide layer 8a interposed, i.e. the MIS capacitance $C_2$ under the leadwire for the base. ($C_{CB}=C_1+C_2$.) Even if the p+ −n junction capacitance $C_1$ is reduced by self-alignment, the contribution of the MIS capacitance $C_2$ will still not be negligible.

The effective reduction of the MIS capacitance $C_2$ may be achieved by reducing the distance x between the p+ base contact region 11 and the element isolating region 9. However, it is known that a dimensional tolerance of 0.2 to 0.3 micron is the limit for the distance x between the p+ base contact region 11 and the element isolating region 9.

Due to the level difference, the thickness y of the silicon dioxide layer 8a is restricted to 0.1 micron or so and cannot be increased.

OBJECT AND SUMMARY OF THE INVENTION

The present invention solves the problems of the prior art discussed above. It is an object to provide an improved semi-conductor device which can be produced by utilizing a trenched element isolation process, in which the parasitic capacitance is further reduced so as to obtain an enhanced superfast operation.

In a semiconductor device having a trenched element isolating region which is formed in a semiconductor body and which has a wiring layer which extends on the element isolating region and which is connected to an impurity region on the semiconductor body, it is a feature of the invention to have an insulator layer region which is buried in the surface portion of the semiconductor body under the wiring layer and which is adjacent to the element isolating region.

The insulator layer region which is buried in the surface portion of the semiconductor body adjacent to the element isolating region c an be formed thick enough to reduce the parasitic capacitance between the wiring layer and the semiconductor body surface. Also, because of the decrease in distance relative to the insulator layer region between the element isolating region and the impurity region, it becomes possible to further decrease the parasitic capacitance between the wiring layer and the semiconductor surface.

BRIEF DESCRIPTION OF THE DRAWINGS

FIGS. 1A through 1O illustrate exemplary steps of producing the semiconductor device of the present invention;

DETAILED DESCRIPTION OF THE PREFERRED EMBODIMENTS

An exemplary example of the present invention as applied to a bipolar transistor integrated circuit will be described with reference to the accompanying drawings including the methods of manufacturing such a circuit.

Figure 1A:
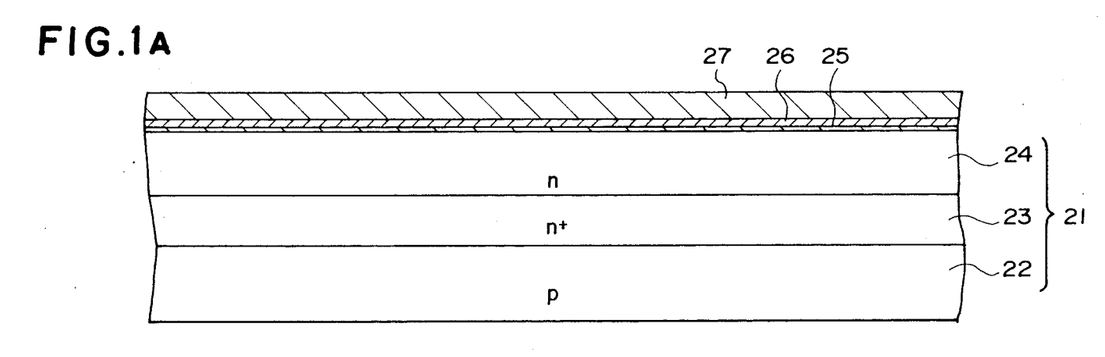

In the embodiment illustrated in FIG. 1A, there is epitaxially deposited on a p-type silicon semiconductor substrate 22, an n-type semiconductor layer 23 of a low resistivity which serves as a collector buried region. Then an n-type semiconductor layer 24 is applied to the semiconductor layer 23 but it has a higher resistivity so as to serve as a collector region. These elements form a semiconductor body 21. Subsequently the upper surface of the semiconductor body 21 is thermally oxidized to form a thin buffer layer 25 of a silicon dioxide film, and there are then formed thereon a silicon nitride film 26; then on film 26 a silicon dioxide film 27 to a thickness of 1 micron. These layers are sequentially formed using chemical vapor deposition (CVD) process or the like.

Figure 1B:
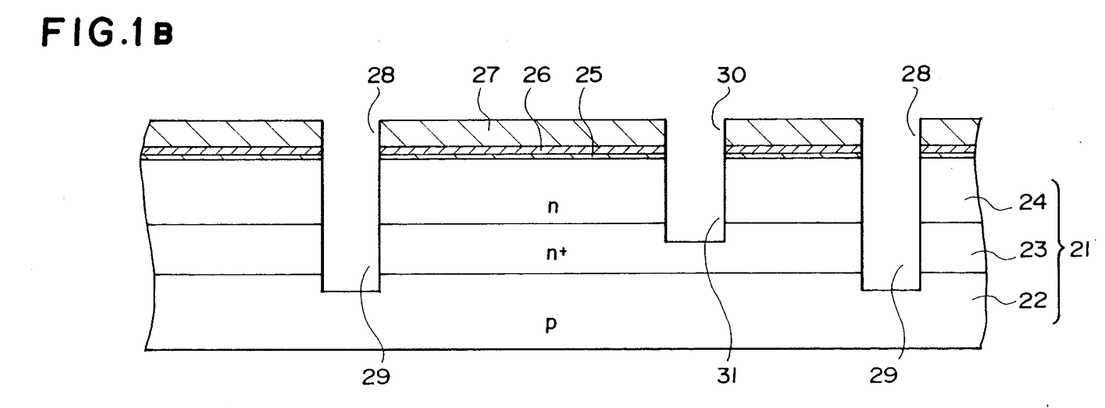

Then as illustrated in FIG. 1B, windows 28 are formed so as to extend through the silicon dioxide film 27, the silicon nitride film 26 and the buffer layer 25 in areas where element isolating trenches are to be formed by using a photoresist layer (not shown).

Then the body 21 is processed anisotropically using a dry etching technique such as RIE (reactive ion etching) to a depth sufficient to penetrate through the semiconductor layers 24 and 23 through the windows 28 and the silicon dioxide film 27, the silicon nitride film 26 and the buffer layer 25 are used as masks, so as to form element isolating first trenches 29. Similarly, a window 30 is formed to extend through the silicon dioxide film 27, the silicon nitride film 26 and the buffer layer 25 in areas where the active region and the collector contact region of the transistor are to be mutually isolated, and a dry etching technique such as RIE is used through the window 30 to form a second region isolating trench 31 which has a depth sufficient to reach the n+ semiconductor layer 23.

Figure 1C:
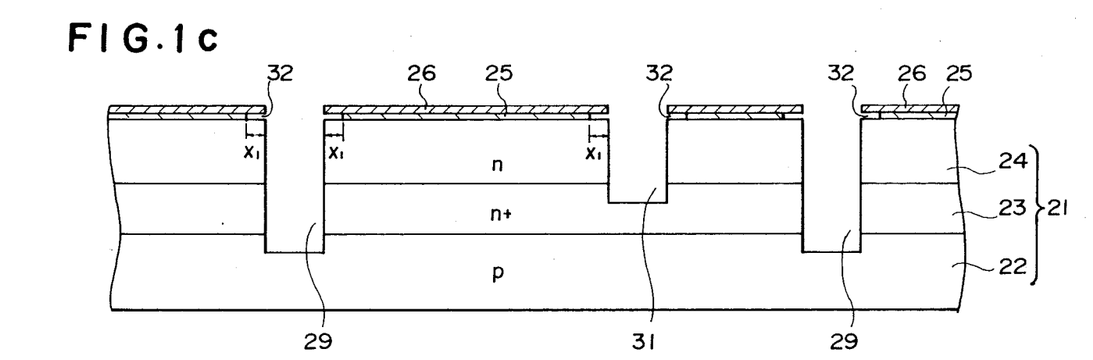

In the next step, illustrated in FIG. 1C, the silicon dioxide film 27 is removed by etching and the buffer layer 25 is also partially etched at its portions adjacent to the inner surfaces of the isolating trenches 29 and 31 and is undercut as illustrated. The length $x_1$ of the undercut portion 32 can be determined as desired by varying the etching time, and the optimal value ranges from 0.1 to 0.2 microns.

Figure 1D:
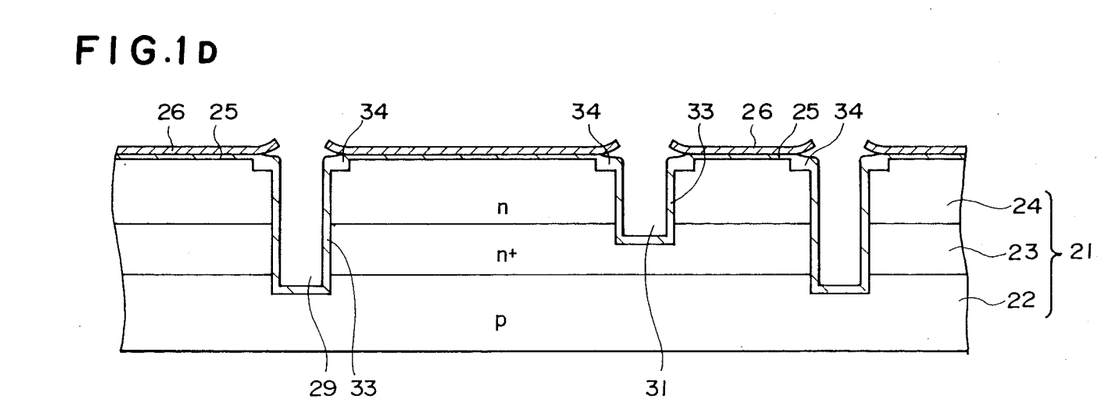

Subsequently, as illustrated in FIG. 1D, the inner wall surfaces of the element isolating first trenches 29 and the region isolating second trench 31 are thermally oxidized with the silicon nitride film 26 as a mask, to form insulator layers 33 of silicon dioxide each of which have thicknesses of 0.1 to 0.3 microns. During this surface thermal oxidation, the semiconductor body surface adjacent to the undercut portion 32 of the buffer layer 25 is simultaneously oxidized. Some bird beak-shaped extensions are formed to serve as insulator layer regions 34 of silicon dioxide and each has a thickness of 0.15 to 0.3 microns which is greater than the thickness of the buffer layer 25.

Figure 1E:
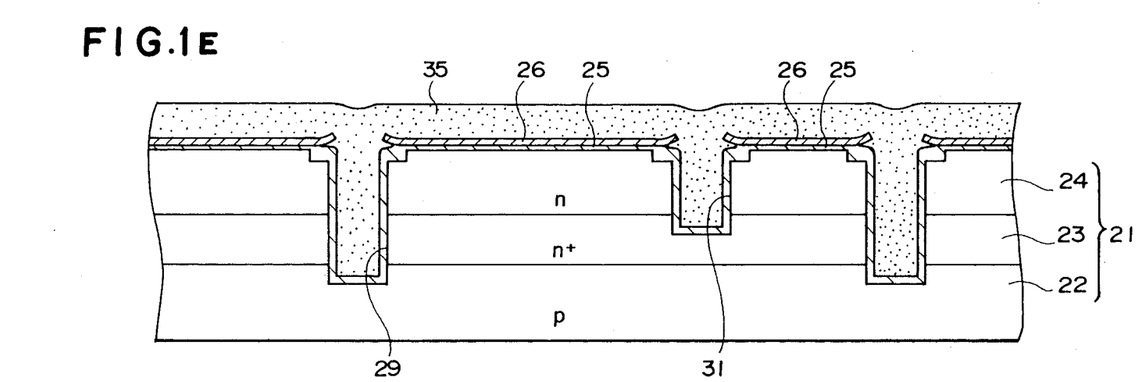

During the next step, illustrated in FIG. 1E, a semiconductor layer such as a polycrystal silicon layer 35 is formed over the entire surface of the body using a CVD process or the like so that the element isolating trenches 29 and the region isolating trench 31 are filled and are buried therein.

Figure 1F:
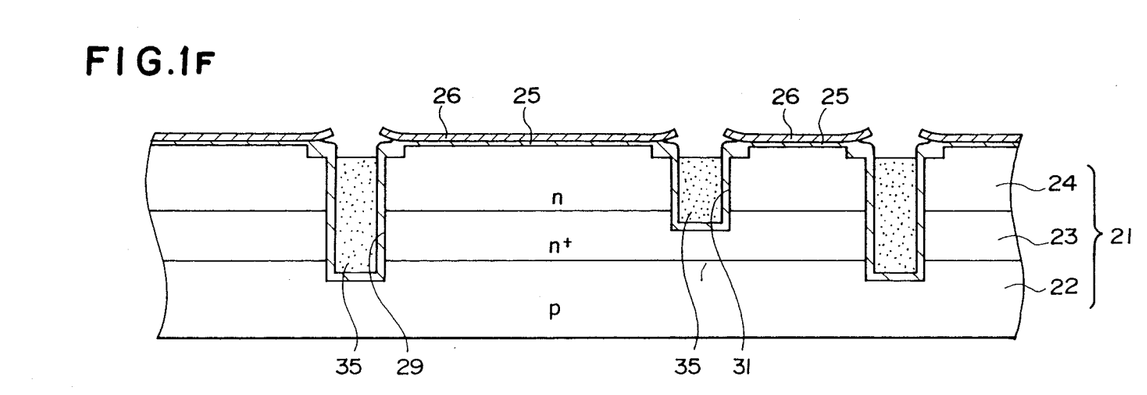

Then as illustrated in FIG. 1F, the polycrystal silicon layer 35 is etched back in a manner such that its upper portion is removed anisotropically by a RIE or the like process down to a predetermined depth from the body surface and it is left unremoved in the element isolating trenches 29 and the region isolating trench 31.

Figure 1G:
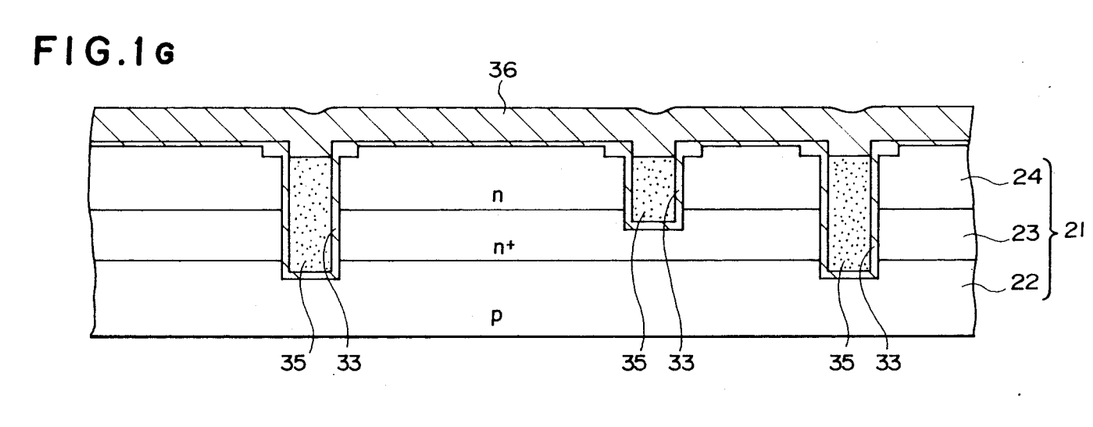

Subsequently, as illustrated in FIG. 1G, the silicon nitride film 26 is removed and then a silicon dioxide layer 36 is formed using a chemical vapor deposition (CVD) process or the like on the semiconductor body 21 including over the element isolating trenches 29 and the region isolating trench 31.

Figure 1H:
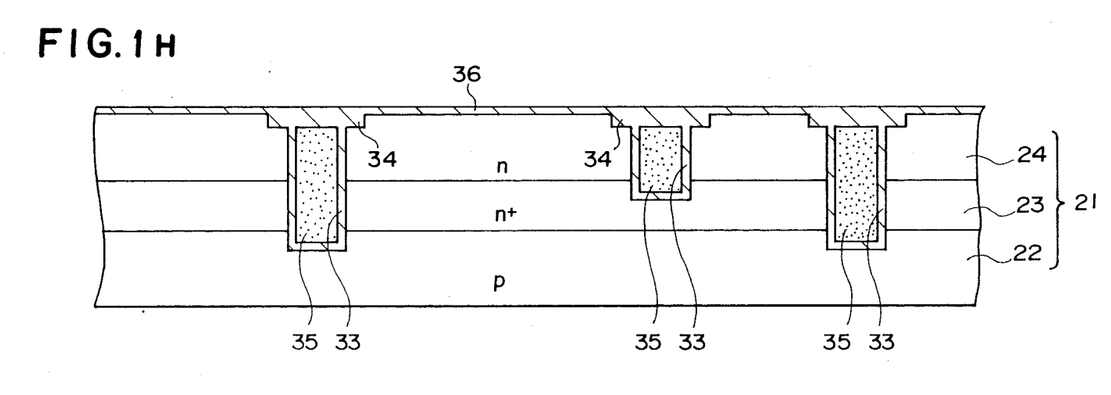
Figure 1I:
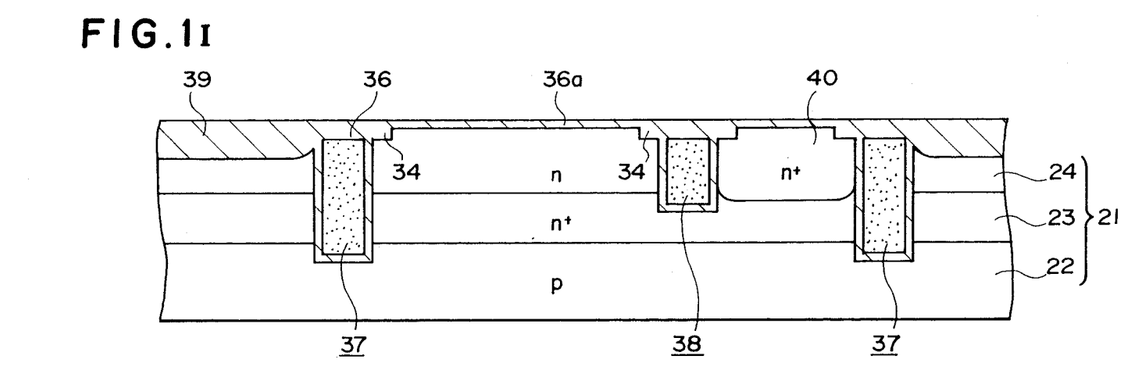

During the next step, illustrated in FIG. 1H, the silicon dioxide layer 36 is etched back by using a RIE process or the like and is buried or extends into the element isolating trenches 29 and the region isolating trench 31 in a manner so as to have a predetermined thickness of 0.1 micron or so over the entire surface of the body 21, thereby forming element isolating regions 37 and an isolating region 38 as shown in FIG. 1I.

Then as illustrated in FIG. 1I, a thick insulator layer 39 of silicon dioxide is formed in the field portion by selective oxidation (LOCOS). Subsequently, an n-type impurity is selectively introduced therein by ion implantation so as to accomplish activation annealing, thus forming an n+ collector contact region 40.

Figure 1J:
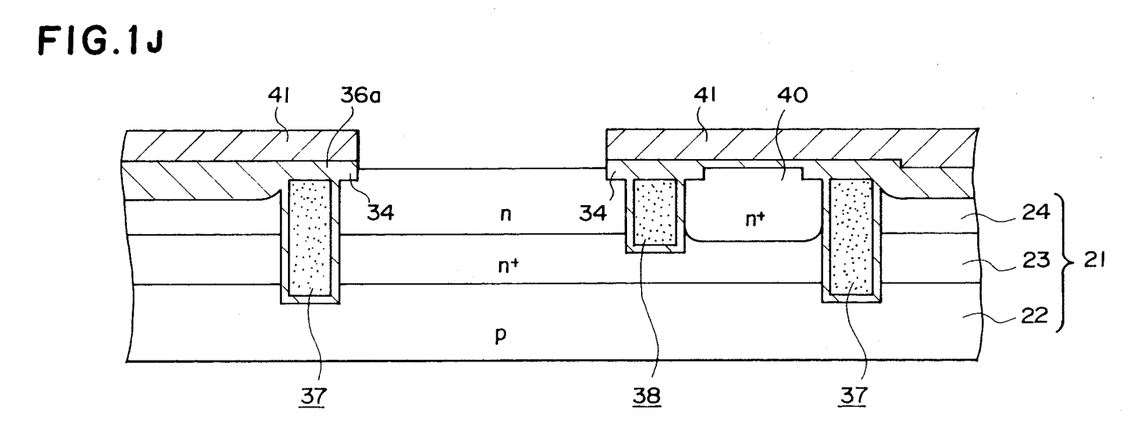

Next, as illustrated in FIG. 1J, the silicon dioxide layer 36a on the active region is selectively removed by etching using a photoresist layer 41. In this example, the removal of the silicon dioxide layer 36a on the active region is performed so as to leave the partial silicon dioxide layer 36a on the thick insulator layer region 34 adjacent to the upper edges of the aforementioned isolating regions 37 and 38, thereby exposing the n-type semiconductor layer 24 in the active region.

Figure 1K:
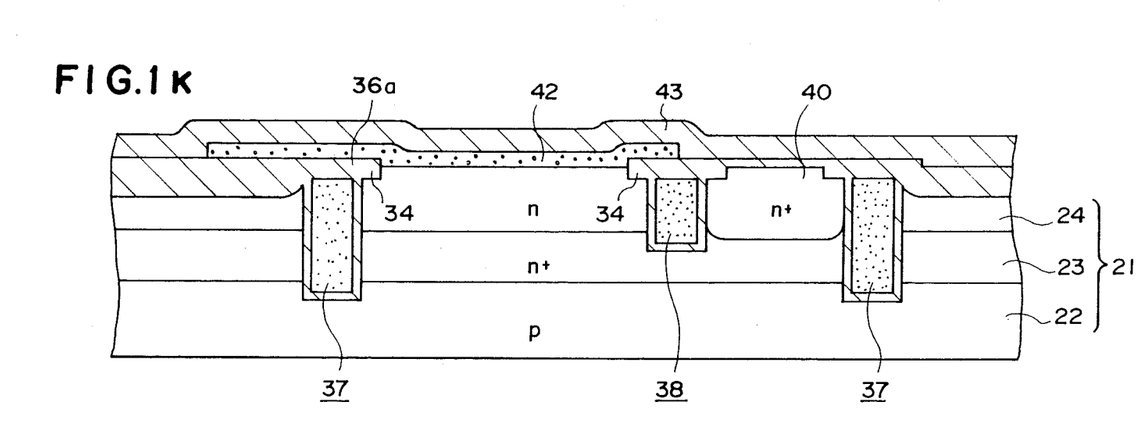

In the next step, illustrated in FIG. 1K, a polycrystal silicon layer 42 doped with a p-type impurity such as boron (B) is deposited using the CVD process or the like on the entire surface except for the portions which are to be finally used as a base contact region and a contact or leadwire for the base electrode. A silicon dioxide layer 43 which will serve as a mask is formed using the CVD process or the like on the entire surface including the polycrystal silicon layer 42.

Figure 1L:
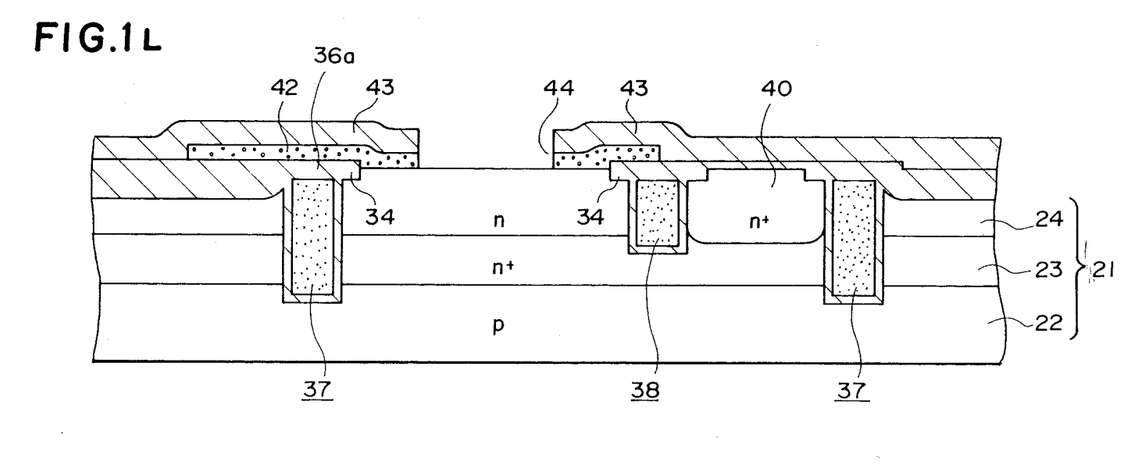

Next, as illustrated in FIG. 1L, the polycrystal silicon layer 42 and the silicon dioxide layer 43 on the portion which is to form a base region are selectively removed by photoetching to form a window 44.

Figure 1M:
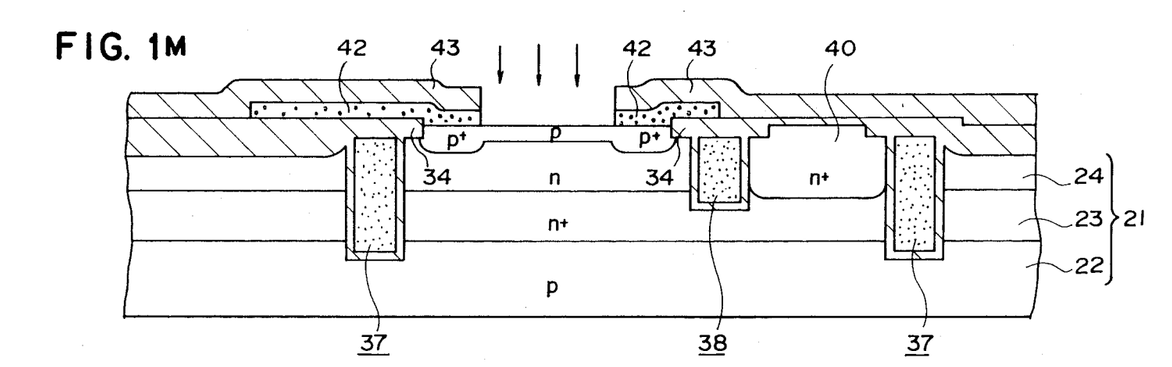

Then as illustrated in FIG. 1M, a p-type impurity such as boron (B) is introduced by ion implantation through the window 44 and, simultaneously a heat treatment is used to activate the ion-implanted region to form a base region 45. The impurity from the polycrystal silicon layer 42 is diffused to form a high-concentration base contact region 46 in the periphery of the base region 45.

Figure 1N:
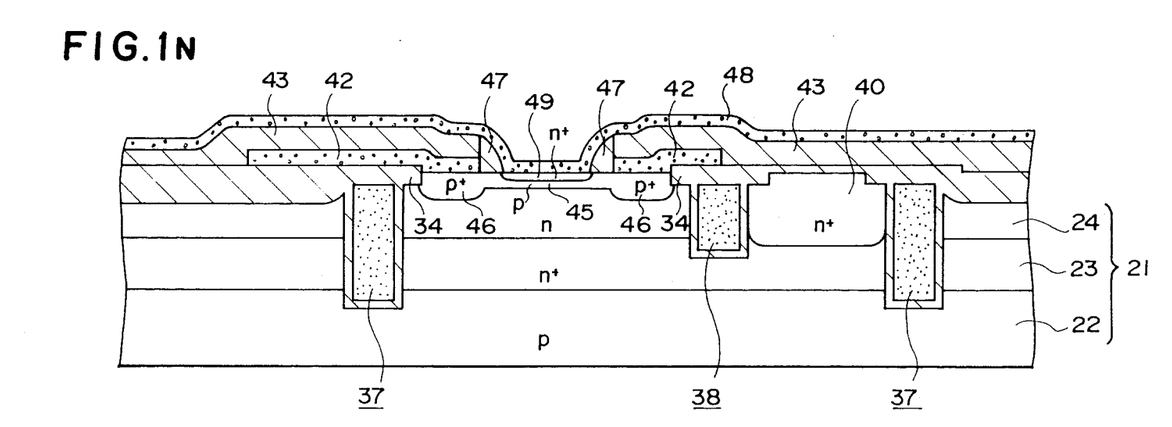

During the next step, illustrated in FIG. 1N, a silicon dioxide layer is deposited on the entire surface using the CVD process or the like, and then anisotropic etching such as RIE is used to form side walls 47 of silicon dioxide on the inner surfaces of the window 44. Subsequently, a polycrystal silicon layer 48 doped with an n-type impurity such as arsenic (As) is deposited on the entire surface inclusive of the base region 45 opposite to the side walls 47 of silicon dioxide and, with a heat treatment, the impurity from the polycrystal silicon layer 48 is diffused to form an emitter region 49.

Thereafter, as illustrated in FIG. 10, an emitter electrode 50 is formed on the patterned polycrystal silicon layer 48, and a base electrode 51 is formed adjacent to the end of the polycrystal silicon layer 42 which will be used as a leadwire. Furthermore, a collector electrode 52 is formed adjacent to the collector contact region 40. The electrodes 50, 51 and 52 are composed of aluminum, for example. When necessary, a barrier metal 53 may be interposed between the electrode and the silicon. Thus, a desirable bipolar transistor integrated circuit 54 is produced.

Figure 5:
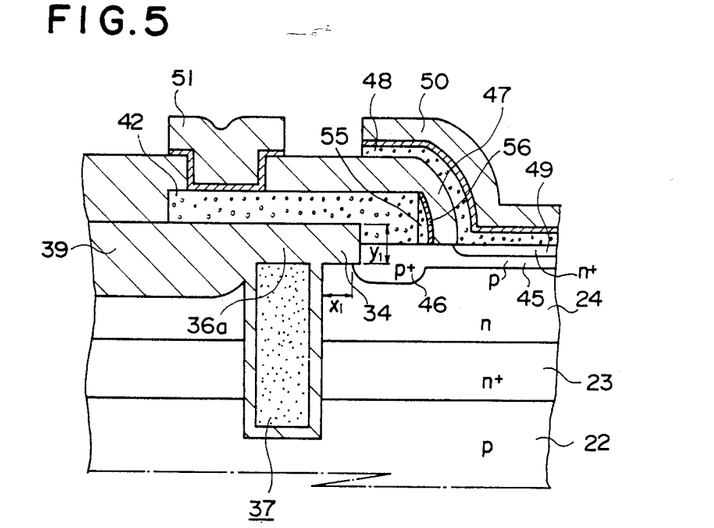
FIG. 5 is a sectional view of the principal components in another embodiment of the invention.

The following steps may also be executed, as illustrated in FIG. 5 after the aforementioned step shown in FIG. 1L. On the entire surface including the window, a second semiconductor layer of polycrystal silicon is formed by the CVD process or the like to serve as a portion of the base electrode.

Then the second semiconductor layer is processed anisotropically by, for example, reactive ion etching (RIE) so that it is etched back so that the semiconductor layer is formed to be thick in the etching direction and is left as a first side wall 55 on the lateral surface of the window. Thus, a base electrode is formed of the first side wall 55 and the remaining portion of the first semiconductor layer 42 which is adjacent thereto.

Next the surface of the first side wall 55 formed of the second semiconductor layer is thermally oxidized to form an oxide film.

Furthermore an insulator layer of, e.g. silicon dioxide is deposited using a CVD process or the like on the entire surface inclusive of the window in the first side wall 55 which has oxide film 56 on its surface.

Subsequently, the insulator layer is anisotropically etched by the RIE process or the like to form a second side wall 47 on the first side wall 55 with the silicon dioxide film 56.

Figure 6:
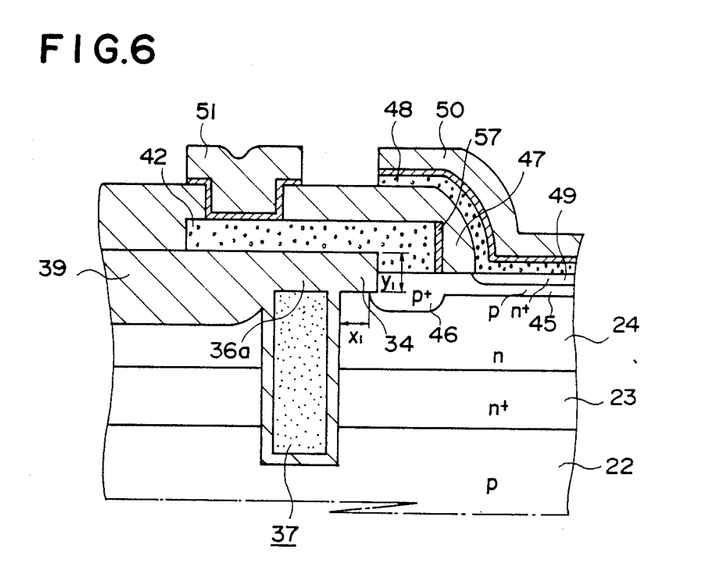
FIG. 6 is a sectional view of the principal components in a further embodiment of the invention.

The above description discloses an exemplary case of applying the present invention to a bipolar transistor wherein a graft base region 46 is selectively formed under the first side wall 55 which partially forms the base electrode. However, in case the structure is such that the base electrode is formed merely of the first semiconductor layer 42 alone without any side wall as shown in FIG. 6, it is possible to form an oxide film 57 by thermally oxidizing the emitter-side end surface of the first semiconductor layer 42 to form the base electrode.

In the structure described, an oxide film 56 or 57 is formed between the base electrode and the emitter electrode by thermally oxidizing at least the semiconductor layer itself of the base electrode. Therefore, due to its size and the step of thermal oxidation, if the insulator layer formed thereon leaks, the very fine oxide film formed by oxidizing the second semiconductor layer therethrough will compensate for such leakage of the insulator layer to consequently increase the dielectric strength between the emitter and the base and also to prevent the generation of any leakage current.

Thus, an improved bipolar transistor having high operational reliability is produced.

In the embodiment described above, the element isolating region 37 and the isolating region 38 are formed by burying the polycrystal silicon layer 35 and the silicon dioxide layer 36 in the isolating trenches 29 and 31. However, the structure may be modified by burying silicon dioxide only in the isolating trenches 29 and 31.

Figure 2:
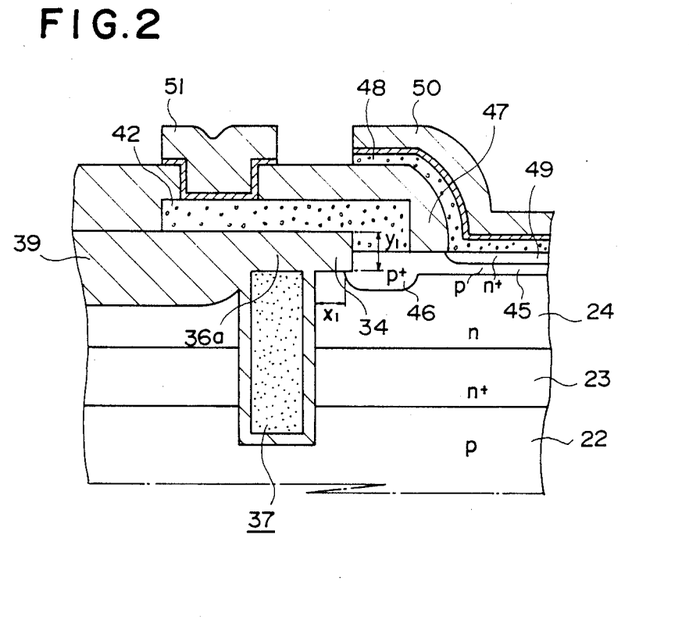
FIG. 2 is an enlarged sectional view of principal components in the semiconductor device.

In such a modified structure, merely the undercut portions formed along the inner walls of the isolating trenches 29, 31 and the upper edges thereof are selectively oxidized so that thick insulator layer regions 34 of silicon dioxide are formed in a manner to be buried in the surface portion of the semiconductor body adjacent to the upper edges of the isolating trenches 29 and 31. Consequently, due to the insulator layer region 34 and the silicon dioxide layer 36a formed thereon as shown in the enlarged view of FIG. 2, the substantial insulator layer between the polycrystal silicon layer 42 which is used as a leadwire for the base electrode and the n-type semiconductor layer 24 which serves as a collector region has a large thickness y1 which ranges from 0.25 to 0.4 microns, thereby reducing the parasitic MIS capacitance $C_2$. Furthermore, because of the undercut and so forth, the tolerance dimension between the isolating region and the base contact region can be determined by self-alignment, whereby the length $x_1$ is decreased to a range of 0.1 to 0.2 microns, hence reducing the parasitic MIS capacitance $C_2$ by an amount corresponding to such decrease. As a result, the capacitance $C_{CB}$ between the base and the collector can be decreased to produce a superfast bipolar transistor integrated circuit.

Figure 3A:
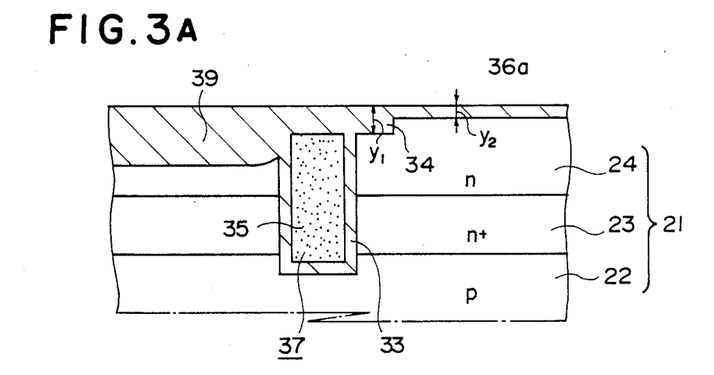
FIGS. 3A through 3C illustrate other exemplary steps for producing the semiconductor device of the invention.
Figure 3B:
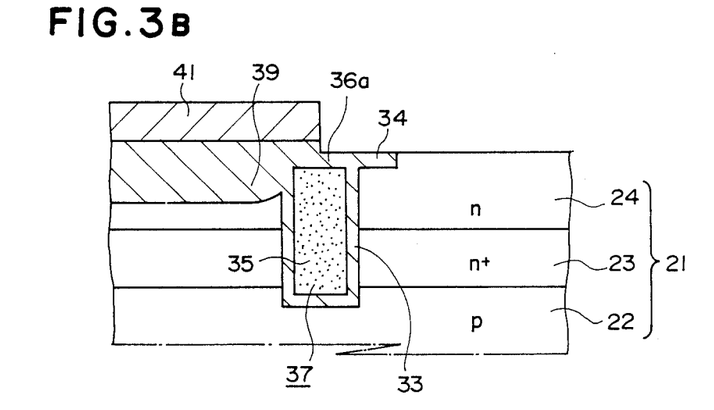
Figure 3C:
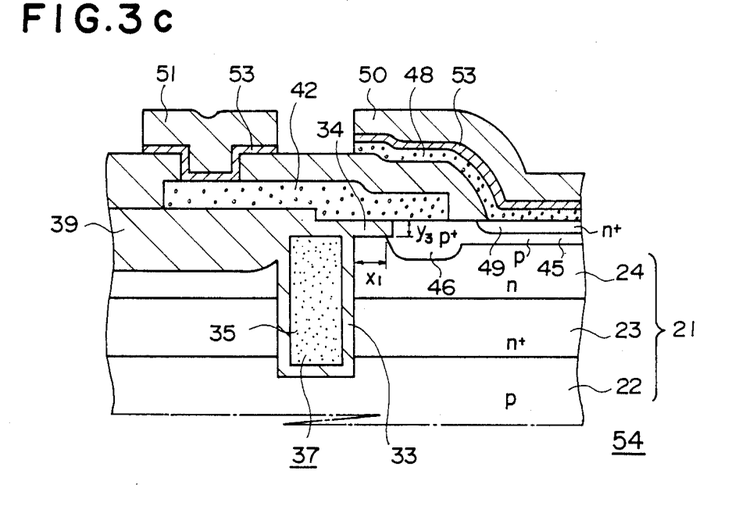

FIGS. 3A through 3C show another preferred embodiment of the present invention. In this example, after the aforementioned step of FIG. 1I or after the element isolating region 37 and the isolating region 38 (not shown) are formed as illustrated in FIG. 3A, the silicon dioxide layer 36a is etched with self-alignment using the photoresist 41, as illustrated in FIG. 3B, by utilizing the difference between the thickness y1 of the insulator layer proximate to the isolating regions 37, 38 and the thickness y2 of the silicon dioxide layer 36a on the body surface spaced apart from such isolating regions 37 and 38, thereby exposing the body surface on the active region. Thereafter the same steps as those after FIG. 1K are executed to produce a bipolar transistor integrated circuit 55 shown in FIG. 3C.

In this bipolar transistor integrated circuit 54 of such construction, due to the existence of the insulator layer region 34 adjacent to the upper edges of the isolating regions 37 and 38, the insulator layer between the polycrystal silicon layer 42 which is used as a leadwire for the base electrode and the n-type semiconductor layer 24 which serves as a collector region can be formed to have a sufficient thickness y3 of 0.3 microns or so which is greater than known values, and the distance $x_1$ between the isolating regions 37, 38 and the base contact regions 46 can be decreased to eventually reduce the parasitic MIS capacitance $C_2$ also, hence decreasing the base-to-collector capacitance $C_{CB}$ as well to consequently produce an enhanced bipolar transistor integrated circuit which can perform superfast operations.

Figure 7:
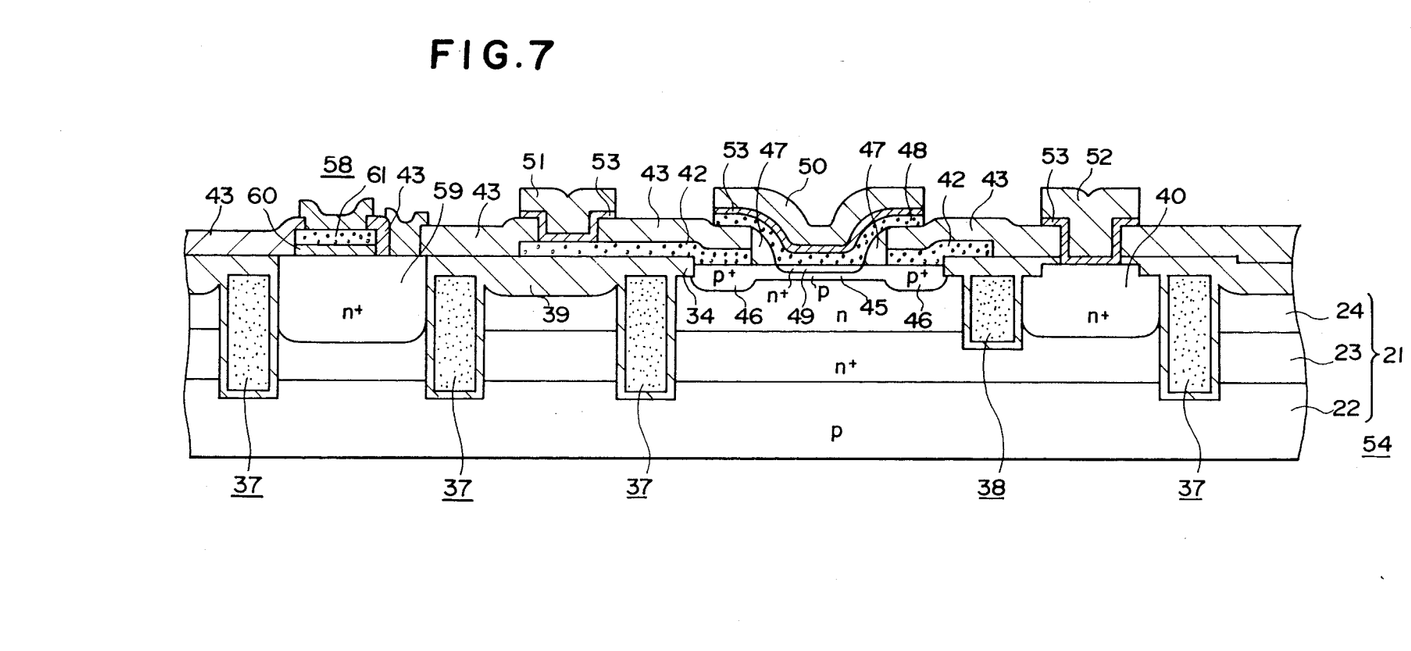
FIG. 7 illustrates an analog integrated circuit which includes bipolar transistors and capacitive elements.
Figure 10:
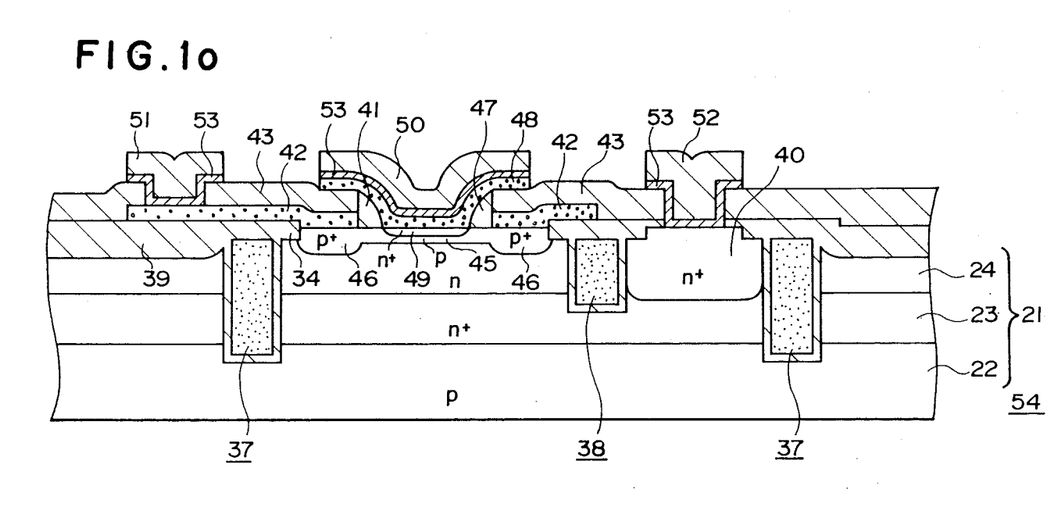

In an analog integrated circuit of bipolar transistors, it is generally necessary to form capacitive elements together with bipolar transistors. An example of such analog integrated circuit with bipolar transistors and capacitive elements according to the present invention is illustrated in FIG. 7, wherein both bipolar transistors 54 and capacitive elements 58 are arranged on a common semiconductor body 21. In the bipolar transistor 54, its base electrode 51 and emitter electrode 50 are composed of first and second low-resistivity semiconductor layers 42 and 48, respectively. The capacitive element 58 has a MIS structure wherein a low-resistivity impurity region 59 which is formed on the semiconductor body 21 is used as one electrode, and a low-resistivity semiconductor 61 is deposited thereon at least as a foundation layer for another electrode using an insulator film 60 or a dielectric film.

In manufacturing the capacitive element 58 of the MIS structure, its low-resistivity impurity region 59 is formed simultaneously with the low-resistivity leadwire region 40 for the collector electrode of the bipolar transistor 54, and the low-resistivity semiconductor layer 61 is formed of the first or second semiconductor layer 42 or 48 which partially forms the bipolar transistor 54.

In the capacitive element 58 of the MIS structure where the low-resistivity impurity region 59 which serves as one electrode is formed of the region of a sufficiently high concentration which is formed simultaneously with the leadwire region 40 for the collector electrode of the bipolar transistor, its sheet resistivity becomes, for example, 10 ohms per square centimeter, so that the distributed resistance therein can be considerably reduced to consequently obtain a satisfactory capacitive element having excellent characteristics with a high Q value. Since the construction is such that no dielectric insulator layer exists on the metal layer of aluminum or the like, a highly reliable insulator film 60 which serves as a dielectric layer can be formed of a sufficiently thin silicon nitride SiNx film having a thickness of 500 angstroms or so. Therefore, in forming the silicon nitride film particularly by the low-pressure chemical vapor deposition (LP-CVD) or vapor phase growth process, it becomes possible to ensure a remarkably fine film with accuracy, hence attaining an increase of the capacitance per area with enhanced stability. Thus, it is possible to achieve a greater integration density and a resultant faster operation, thereby obtaining a semiconductor device of high reliability and enhanced stability, such as an analog integrated circuit of bipolar transistors.

Since an aluminum layer does not exist under the dielectric insulator layer 60 of the capacitive element of the MIS structure, there is no necessity for a large film thickness which may otherwise be reburied to compensate for the surface roughness with hillocks and so forth, and therefore the insulator film may be formed to be as thin as 500 angstroms or so, hence increasing the capacitance per area and attaining high reliability due to its flatness.

Also, as the device is so formed that the low-resistivity semiconductor layer 61 is deposited on the insulator film 60, it is possible to protect such insulator film 60 during the step of forming a window in the aforementioned insulator layer 43 or when executing anisotropic dry etching or RIE to pattern the second low-resistivity semiconductor layer 61, thereby enhancing the stability and quality of the dielectric insulator film 60 to eventually form a satisfactory capacitive element 58 of remarkably high reliability with resulting advantages.

Thus, in a semiconductor device having trench-shaped element isolating regions formed in a semiconductor body and also a wiring layer extending on each element isolating region and connected to an impurity region on the semiconductor body, the present invention provides that an insulator layer region is buried in the surface portion of the semiconductor body under the wiring layer and adjacent to the element isolating region, whereby the insulation space between the wiring layer and the semiconductor body surface can be increased while the distance between the element isolating region and the impurity region can be shortened. As a result, the parasitic capacitance between the wiring layer and the semiconductor body can be decreased to eventually attain a faster operation in the semiconductor device. Particularly when the present invention is applied to a bipolar transistor integrated circuit, the capacitance $C_{CB}$ between its base and collector can be reduced to consequently realize superfast operation in a bipolar transistor integrated circuit.

Although the invention has been described with respect to preferred embodiments, it is not to be so limited as changes and modifications can be made which are within the full intended scope of the invention as defined by the appended claims.

We claim as our invention:

1. A semiconductor device comprising:
   a semiconductor substrate of one conductivity type,
   a layer of semiconductor material of opposite conductivity type on said substrate;
   isolation trenches extending into said layer to laterally surround and separate portions of said layer of semiconductor material from each other;
   a layer of insulating material within and lining said trenches;
   a region of insulating material at the surface of at least one isolated portion of said layer of semiconductor material, said region of insulating material extending laterally from said isolation trenches into said isolated portion, said region of insulating material being at least partially recessed into the surface of said at least one isolated portion of said layer of semiconductor material, said region of insulating material having a flat bottom portion adjacent said trench, said flat bottom portion extending from said trench laterally into said isolated portion by a distance of between 0.1 micron and 0.2 micron and having a substantially uniform lateral extent at all portions surrounding said isolated portion,
   a region of semiconductor material of said first conductivity type within and extending to the surface of said isolated portion and spaced from said isolation trenches, said region of semiconductor material abutting said region of insulating material,
   and a conductive layer overlying said region of insulating material and contacting said region of semiconductor material so as to form an electrical connection to said region of semiconductor material,
   whereby said region of insulating material isolates said conductive layer from portion of said isolated portion lying between said region of semiconductor material and said isolation trenches by a greater thickness of insulation material than the step between the upper surface of said region of insulating material and the surface of said isolated portion, without unduely increasing the spacing between said region of semiconductor material and said isolation trenches.

2. A semiconductor device according to claim 1 formed with integrated capacitive elements, wherein one electrode of said capacitive element is formed of a semiconductor region, and a second electrode is formed of said conductive layer.

* * * * *